United States Patent
Hochschild

(10) Patent No.: US 6,795,005 B2
(45) Date of Patent: Sep. 21, 2004

(54) VARIABLE, ADAPTIVE QUANTIZATION IN SIGMA-DELTA MODULATORS

(75) Inventor: James R. Hochschild, Plano, TX (US)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 10/453,426

(22) Filed: Jun. 3, 2003

(65) Prior Publication Data

US 2004/0160348 A1 Aug. 19, 2004

Related U.S. Application Data

(60) Provisional application No. 60/447,160, filed on Feb. 13, 2003.

(51) Int. Cl.[7] .................................................. H03M 3/00
(52) U.S. Cl. ........................................ 341/143; 341/144
(58) Field of Search ................................ 341/143, 144, 341/139

(56) References Cited

U.S. PATENT DOCUMENTS 4,843,390 A * 6/1989 Van Bavel et al. ......... 341/139
5,117,234 A * 5/1992 Shizawa ..................... 341/143
6,531,973 B2   3/2003 Brooks et al. .............. 341/143
6,535,153 B1   3/2003 Zierhofer ................... 341/143

* cited by examiner

Primary Examiner—Brian Young
Assistant Examiner—Joseph Lauture
(74) Attorney, Agent, or Firm—W. Daniel Swayze, Jr.; W. James Brady; Frederick J. Telecky, Jr.

(57) ABSTRACT

An improved sigma-delta modulation technique that may be employed in a sigma-delta Digital-to-Analog Converter (DAC) to convert digital signals into corresponding analog signals over a wide signal range and with high linearity. The sigma-delta DAC comprises a sigma-delta modulator including a variable quantizer and a quantizer controller, and an internal DAC. The sigma-delta modulator adaptively quantizes the digital input signal to a first number p of quantization levels. Next, the quantizer controller controls the variable quantizer to correlate the p quantization levels to the amplitude of the digital input signal, thereby generating a second number q of quantization levels. The internal DAC then receives the q quantization levels from the variable quantizer one group of p levels at a time, and produces an analog output signal therefrom that corresponds to the digital input signal.

15 Claims, 5 Drawing Sheets

*Fig. 1 - Prior Art*

VARIABLE, ADAPTIVE QUANTIZATION IN SIGMA-DELTA MODULATORS

CROSS REFERENCE TO RELATED APPLICATIONS

This application claims priority of U.S. Provisional Patent Application No. 60/447,160 filed Feb. 13, 2003 entitled VARIABLE, ADAPTIVE QUANTIZATION IN SIGMA-DELTA MODULATORS.

STATEMENT REGARDING FEDERALLY SPONSORED RESEARCH OR DEVELOPMENT

N/A

BACKGROUND OF THE INVENTION

The present application relates generally to signal processing, and more specifically to improved systems and methods of performing sigma-delta modulation.

Sigma-delta modulators are known that may be employed in signal processors such as Digital-to-Analog Converters (DACs). For example, a conventional sigma-delta DAC typically comprises a digital sigma-delta modulator including a sigma-delta core circuit and a quantizer, and an internal DAC. In a normal mode of operation, the sigma-delta core circuit receives a digital input signal and provides its output to the quantizer, which in turn provides its output directly to the internal DAC and to the sigma-delta core via a feedback path. The sigma-delta modulator quantizes the digital input signal to a predetermined number of quantization levels. Specifically, the sigma-delta core circuit subtracts the output of the quantizer from the digital input signal, and outputs a representation of the sum of its previous input and its previous output. The quantizer then generates the appropriate quantization level based on the output provided to it by the sigma-delta core circuit. Finally, the internal DAC receives the quantization levels from the quantizer, and produces an analog output signal therefrom corresponding to the digital input signal.

The conventional sigma-delta DAC may be configured as a single-bit sigma-delta DAC or a multi-bit sigma-delta DAC. In a typical single-bit configuration, the digital input signal is converted into a binary sequence by a 1-bit quantizer, and the binary sequence is converted into the analog output signal by a 1-bit internal DAC. In a typical multi-bit configuration, the digital input signal is quantized to three or more quantization levels by a multi-bit quantizer to generate a digital sequence, which is subsequently converted into the analog output signal by a multi-bit internal DAC.

Although the conventional single-bit sigma-delta DAC is typically highly linear due to the inherent linearity of the 1-bit internal DAC, the single-bit sigma-delta DAC has drawbacks in that its signal range is limited. In contrast, the conventional multi-bit sigma-delta DAC has a wider signal range. However, the non-linearity of the multi-bit internal DAC included in the multi-bit sigma-delta DAC can cause increased signal distortion and noise. For this reason, suitable trim calibration and dynamic element matching techniques are frequently employed to improve the linearity of the multi-bit DAC.

It would therefore be desirable to have an improved sigma-delta modulation technique that may be employed in digital-to-analog converters and avoids the drawbacks of the above-described conventional techniques.

BRIEF SUMMARY OF THE INVENTION

In accordance with the present invention, an improved sigma-delta modulation technique is provided that may be employed in Digital-to-Analog Converters (DACs) to convert digital input signals into corresponding analog output signals over a wide signal range and with high linearity. The presently disclosed sigma-delta modulation technique achieves such benefits by adaptively quantizing a digital input signal to a reduced number of quantization levels, and correlating the magnitudes of the quantization levels to the amplitude of the digital input signal. The quantization levels may then be provided to a DAC to produce an analog output signal that corresponds to the digital input signal.

In one embodiment, the sigma-delta modulation technique is employed in a sigma-delta DAC that comprises a digital sigma-delta modulator and an internal DAC. The sigma-delta modulator includes a sigma-delta core circuit, a variable quantizer, and a quantizer controller. The sigma-delta core circuit receives a digital input signal and provides its output to the variable quantizer, which in turn provides its output to the internal DAC and to the sigma-delta core via a feedback path. The sigma-delta modulator adaptively quantizes the digital input signal to a predetermined number of quantization levels.

In the preferred embodiment, the sigma-delta modulator is configured for adaptively quantizing the digital input signal to 2 or 3 quantization levels. The quantizer controller controls the variable quantizer to correlate the 2–3 quantization levels to the amplitude of the digital input signal. To that end, the quantizer controller receives the digital input signal, monitors the amplitude of the digital input signal, and controls the variable quantizer to adjust the magnitudes of the quantization levels based on the input signal amplitude. As the amplitude of the digital input signal increases (decreases), the magnitudes of the 2–3 quantization levels are suitably increased (decreased). The internal DAC then receives all of the quantization levels from the variable quantizer in successive groups of 2 or 3 levels, and produces an analog output signal therefrom that corresponds to the digital input signal. The internal DAC is configured to be highly linear within each group of quantization levels, but may provide reduced linearity between the groups of levels.

By adaptively quantizing a digital input signal to 2 or 3 quantization levels, correlating the magnitudes of the 2–3 quantization levels to the amplitude of the digital input signal, and successively providing all of the resulting quantization levels one group of 2–3 levels at a time to an internal DAC to produce a corresponding analog output signal, digital-to-analog signal conversion can be achieved over a wide signal range and with high linearity.

Other features, functions, and aspects of the invention will be evident from the Detailed Description of the Invention that follows.

BRIEF DESCRIPTION OF THE SEVERAL VIEWS OF THE DRAWINGS

The invention will be more fully understood with reference to the following Detailed Description of the Invention in conjunction with the drawings of which.

DETAILED DESCRIPTION OF THE INVENTION

U.S. Provisional Patent Application No. 60/447,160 filed Feb. 13, 2003 entitled VARIABLE, ADAPTIVE QUANTIZATION IN SIGMA-DELTA MODULATORS is incorporated herein by reference.

An improved sigma-delta modulation technique is disclosed that may be employed in Digital-to-Analog Converters (DACs) to convert digital input signals into corresponding analog output signals over a wide signal range and with high linearity. The presently disclosed sigma-delta modulation technique includes adaptively quantizing a digital input signal to a reduced number "p" of quantization levels and correlating the magnitudes of the quantization levels to the amplitude of the digital input signal. All of the resulting quantization levels may then be provided in successive groups of p levels each to an internal DAC to produce a corresponding analog output signal.

Figure 1:
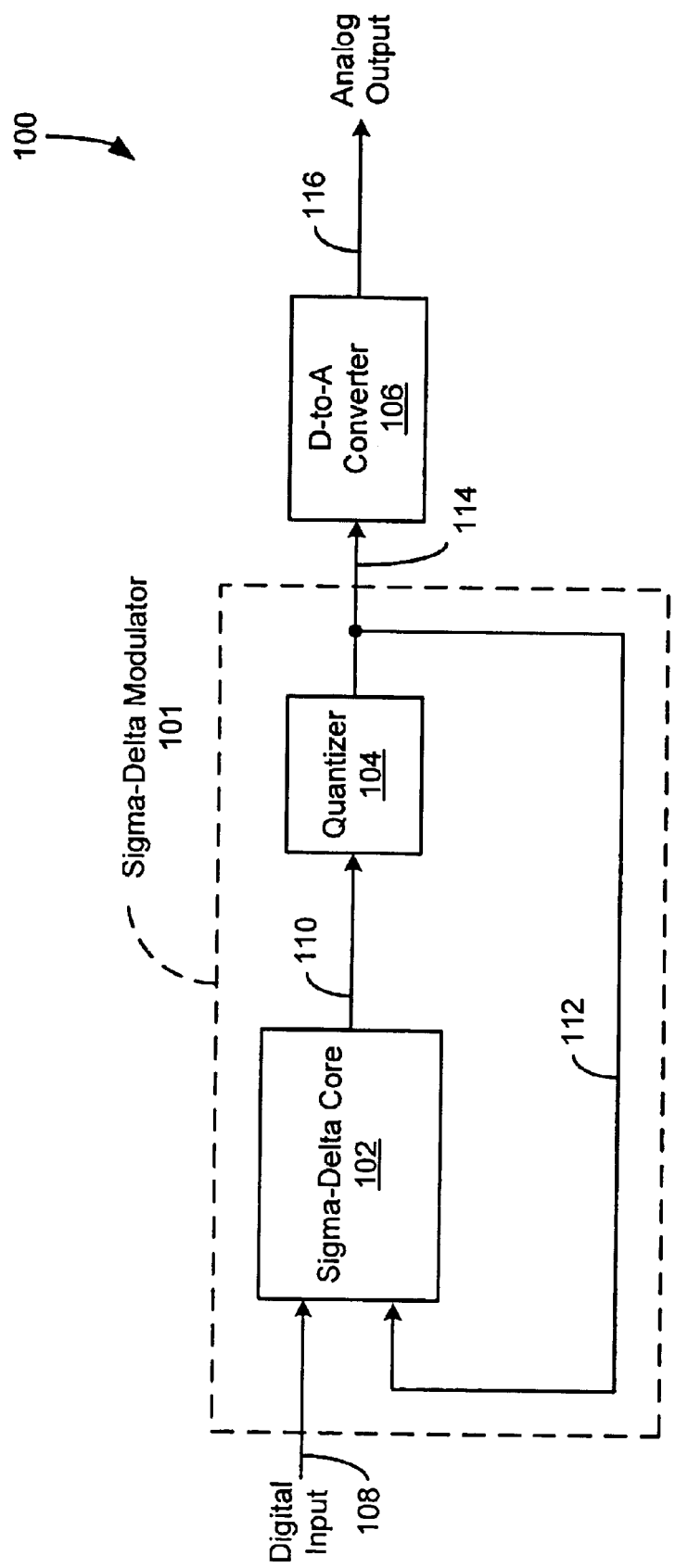
FIG. 1 is a block diagram of a conventional sigma-delta digital-to-analog converter.

FIG. 1 depicts a representation of a conventional sigma-delta DAC 100, which comprises a digital sigma-delta modulator 101-including an input stage 102 (herein referred to as a sigma-delta core circuit) and a quantizer 104, and an internal DAC 106. As shown in FIG. 1, the sigma-delta core circuit 102 receives a digital input signal over a line 108, and provides its output to the quarntizer 104 over a line 110. The quantizer 104 provides its output directly to the internal DAC 106 over a line 114, and to the sigma-delta core 102 via a feedback path 112.

The sigma-delta modulator 101 is configured to quantize the digital input signal down to a plurality of quantization levels. Specifically, the sigma-delta core circuit 102 subtracts the output of the quantizer 104 from the digital input signal and outputs a representation of the sum of its previous input and its previous output. The quantizer 104 then generates the appropriate quantization level based on the output provided by the sigma-delta core 102. Next, the internal DAC 106 receives the quantization levels from the quantizer 104, generates an analog output signal therefrom corresponding to the digital input signal, and provides the analog output signal over the line 116.

The conventional sigma-delta DAC 100 of FIG. 1 may be configured as a single-bit sigma-delta DAC or a multi-bit sigma-delta DAC. For example, in the single-bit configuration, a digital input signal x(n) having a signal range $-a \leq x(n) \geq +a$ may be converted into a binary sequence $y(n) \epsilon \pm a$ (i.e., two quantization levels) by the sigma-delta modulator 101. The binary sequence is then converted into an analog output signal by the internal DAC 106. In the conventional single-bit sigma-delta DAC, the quantizer 104 is typically a 1-bit quantizer for quantizing the digital input signal x(n) to the two quantization levels a of the binary sequence y(n), and the internal DAC 106 is typically a 1-bit DAC. In the conventional multi-bit sigma-delta DAC, the quantizer 104 is configured as a multi-bit quantizer that quantizes the digital input signal x(n) to three or more quantization levels to generate a digital sequence. Further, the internal DAC 106 is configured as a multi-bit DAC to convert the digital sequence into a corresponding analog output signal.

Although the above-described conventional single-bit sigma-delta DAC typically performs digital-to-analog signal conversion with high linearity, the 1-bit digital-to-analog signal conversion generally provides limited signal range. Moreover, whereas the above-described conventional multi-bit sigma-delta DAC typically provides a wider signal range, the multi-bit digital-to-analog signal conversion is frequently nonlinear.

Figure 2:
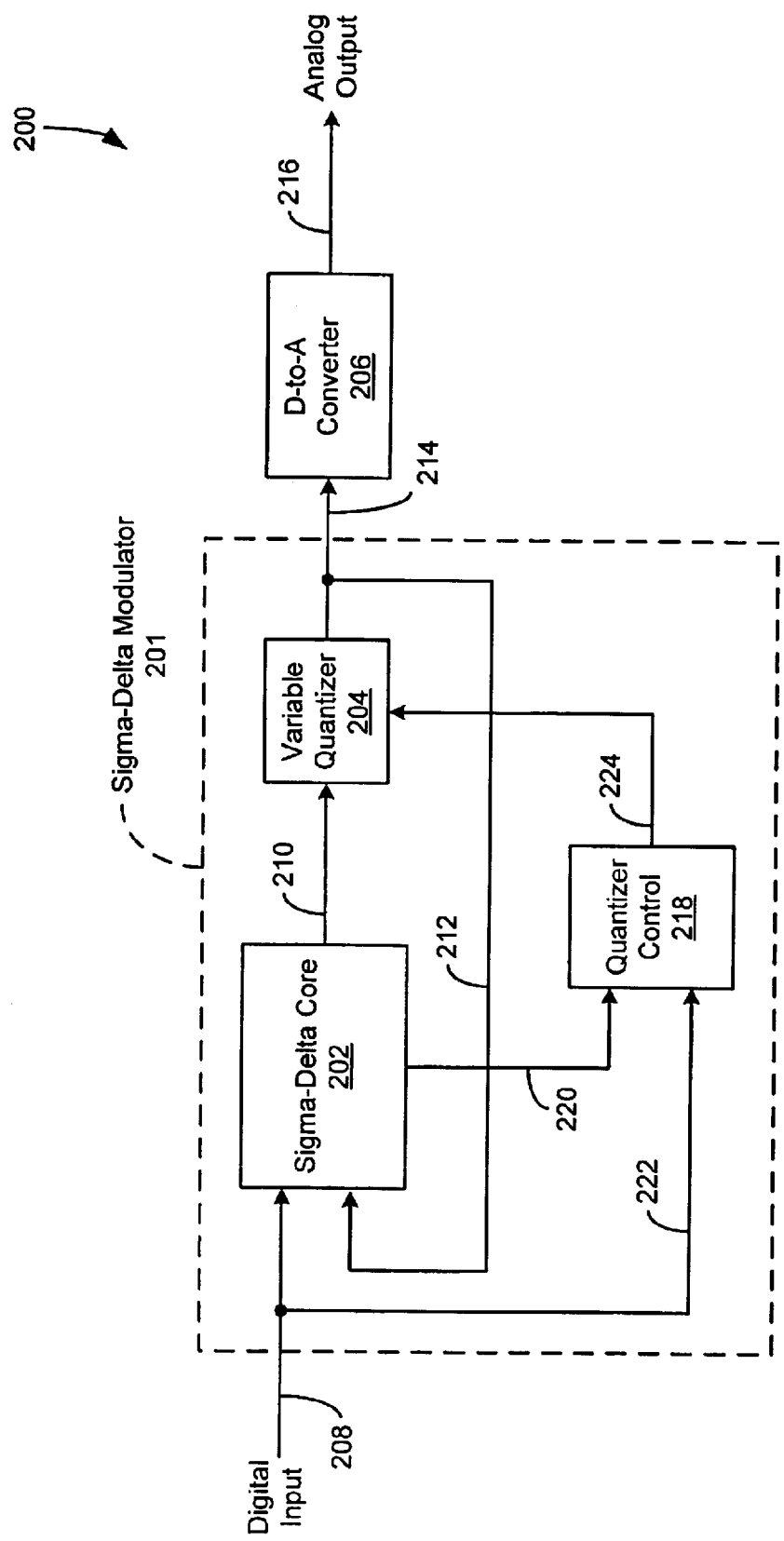
FIG. 2 is a block diagram of a sigma-delta digital-to-analog converter according to the present invention.

FIG. 2 depicts an illustrative embodiment of a sigma-delta Digital-to-Analog Converter (DAC) 200, in accordance with the present invention. The sigma-delta DAC 200 performs digital-to-analog signal conversion over a wide signal range and with high linearity. In the illustrated embodiment, the sigma-delta DAC 200 comprises a digital sigma-delta modulator 201 and an internal DAC 206. The sigma-delta modulator 201 includes an input stage 202 (herein referred to as a sigma-delta core circuit), a variable quantizer 204, and a quantizer controller 218. As shown in FIG. 2, the sigma-delta core circuit 202 receives a digital input signal over a line 208, and provides an intermediate digital output signal to the variable quantizer 204 over a line 210. The variable quantizer 204 provides its output directly to the internal DAC 206 over a line 214, and to the sigma-delta core 202 via a feedback path 212. The quantizer controller 218 receives the digital input signal over a line 222. In the preferred embodiment, the quantizer controller 218 further receives the state of one or more integrators (not shown) included in the sigma-delta core circuit 202 over a line 220. The quantizer controller 218 then provides its control output to the variable quantizer 204 over a line 224. The operation of the ouantizer controller 218 in conjunction with the sigma-delta core circuit 202 and the variable quantizer 204 is described below.

In the presently disclosed embodiment, the sigma-delta DAC 200 adaptively quantizes the digital input signal to a predetermined number "q" n of quantization levels to convert the digital input signal into the corresponding analog output signal. Specifically, the variable quantizer 204 successively provides a predetermined number "p" ($p \leq q$) of the q quantization levels one group of p levels at a time to the internal DAC 206. Further, the quantizer controller 218 adaptively selects which quantization levels are provided to the DAC by the quantizer based on the amplitude of the digital input signal. In the illustrated embodiment, each group of quantization levels provided to the internal DAC 206 by the variable quantizer 204 includes the reduced number p of quantization levels, e.g., 2 or 3 levels, and the internal DAC 206 is configured to convert all of the q quantization levels to generate the analog output signal. Moreover, because the total number q of quantization levels provided to the internal DAC 206 to generate the analog output signal may exceed the reduced number p of levels in each successive group, increased signal range can be achieved. The sigma-delta DAC 200 can therefore be made to perform desired digital-to-analog signal conversions over wide signal ranges and with high linearity. It is noted that the internal DAC 206 is configured to be highly linear within each group of p quantization levels, but may provide reduced linearity between the groups of levels.

More specifically, the quantizer controller 218 is configured to control the variable quantizer 204 to correlate the magnitudes of the predetermined number p of quantization levels to the amplitude of the digital input signal. To that end, the quantizer controller 218 receives the digital input signal over the line 222, monitors the amplitude of the digital input signal, and controls the variable quantizer 204 to adjust the magnitudes of the p quantization levels based on the input signal amplitude.

The illustrative embodiment disclosed herein will be better understood with reference to the following examples. In a first example, the sigma-delta modulator 201 (see FIG.

2) is configured to quantize a digital input signal to p=2 quantization levels −L, +L, in which L is a variable that assumes only values in the discrete set {1,2,3,4}. A sigma-delta DAC including such a sigma-delta modulator is herein referred to as a $4^{th}$-order sigma-delta DAC. It should be appreciated that the variable L may assume values in any suitable discrete set having a predetermined number of values "1". In this first example, 1=4. The quantizer controller 218 is configured to detect an increase (decrease) in the amplitude of the digital input signal, and to apply one or more control signals to the variable quantizer 204 for suitably adjusting, i.e., increasing (decreasing) the value of L based on the detected change in the input signal amplitude. The variable quantizer 204 is therefore controlled by the quantizer controller 218 to generate a total of $$q=2*(1)=2*(4), \qquad (1)$$

or q=8 different quantization levels, i.e., $$-4,-3,-2,-1,+1,+2,+3,+4, \qquad (2)$$

based on the amplitude of the digital input signal, and to successively provide the quantization levels to the internal DAC 206 in groups of p=2, e.g., $$-4,+4;\ -3,+3;\ -2,+2;\ \text{or}\ -1,+1, \qquad (3)$$

for subsequent generation of the corresponding analog output signal.

In a second example, the sigma-delta modulator 201 (see FIG. 2) is configured to quantize the digital input signal to p=3 quantization levels −L, 0, and +L, in which in which L is a variable that assumes only values in the discrete set {−1,2,3,4}. As in the first example above, 1=4, and the quantizer controller 218 is configured to detect an increase (decrease) in the amplitude of the digital input signal and to apply one or more control signals to the variable quantizer 204 for suitably adjusting, i.e., increasing (decreasing) the value of L based on the detected change in the input signal amplitude. The variable quantizer 204 is therefore controlled by the quantizer controller 218 to generate a total of $$q=2*(1)+1=2*(4)+1, \qquad (4)$$

or q=9 different quantization levels, i.e., $$-4,-3,-2,-1, 0, +1,+2,+3,+4, \qquad (5)$$

based on the amplitude of the digital input signal, and to successively provide the quantization levels to the internal DAC 206 in groups of p=3, e.g., $$-4,0,+4;\ -3,0,+3;\ -2,0,+2;\ \text{or}\ -1,0,+1, \qquad (6)$$

for subsequent generation of the corresponding analog output signal.

Figure 3:
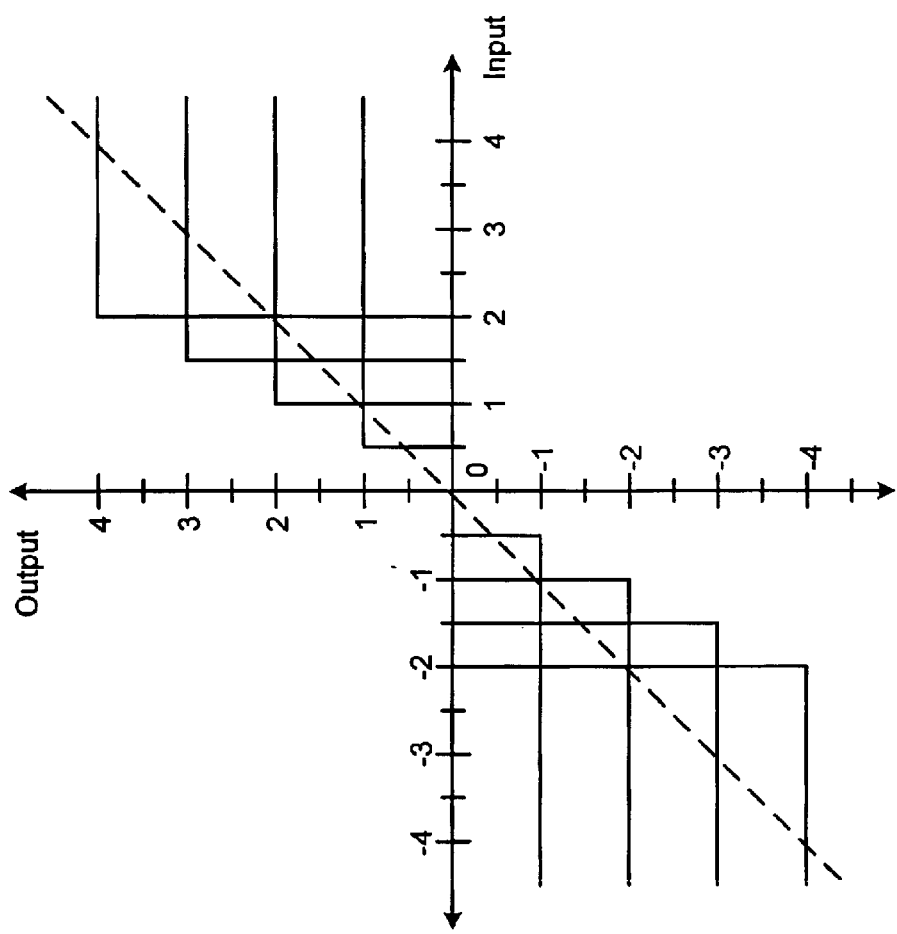
FIG. 3 is a diagram illustrating the transfer function of a variable quantizer included in the sigma-delta digital-to-analog converter of FIG. 2.

FIG. 3 illustrates the transfer function of the variable quantizer 204 included in the sigma-delta DAC 200 (see FIG. 2) configured as the above-described $4^{th}$-order sigma-delta DAC (p=3). As indicated in FIG. 3, p=3 output levels −L, 0, and +L are provided by the variable quantizer 204 to the internal DAC 206 in which L$\epsilon${1,2,3,4}. It should be noted that to maintain the stability of the $4^{th}$-order sigma-delta DAC, the variable quantizer 204 is configured so that its gain is constant independent of the value of L. Further, provided that the quantizer controller 218 controls the variable quantizer 204 so that the value of L switches relatively infrequently, any DAC errors occurring between the different L values would typically appear as gain errors, which may be acceptable in applications such as voice and audio. Such DAC errors would normally not cause out-of-band quantization noise to inter-modulate back into the pass-band.

Figure 4:
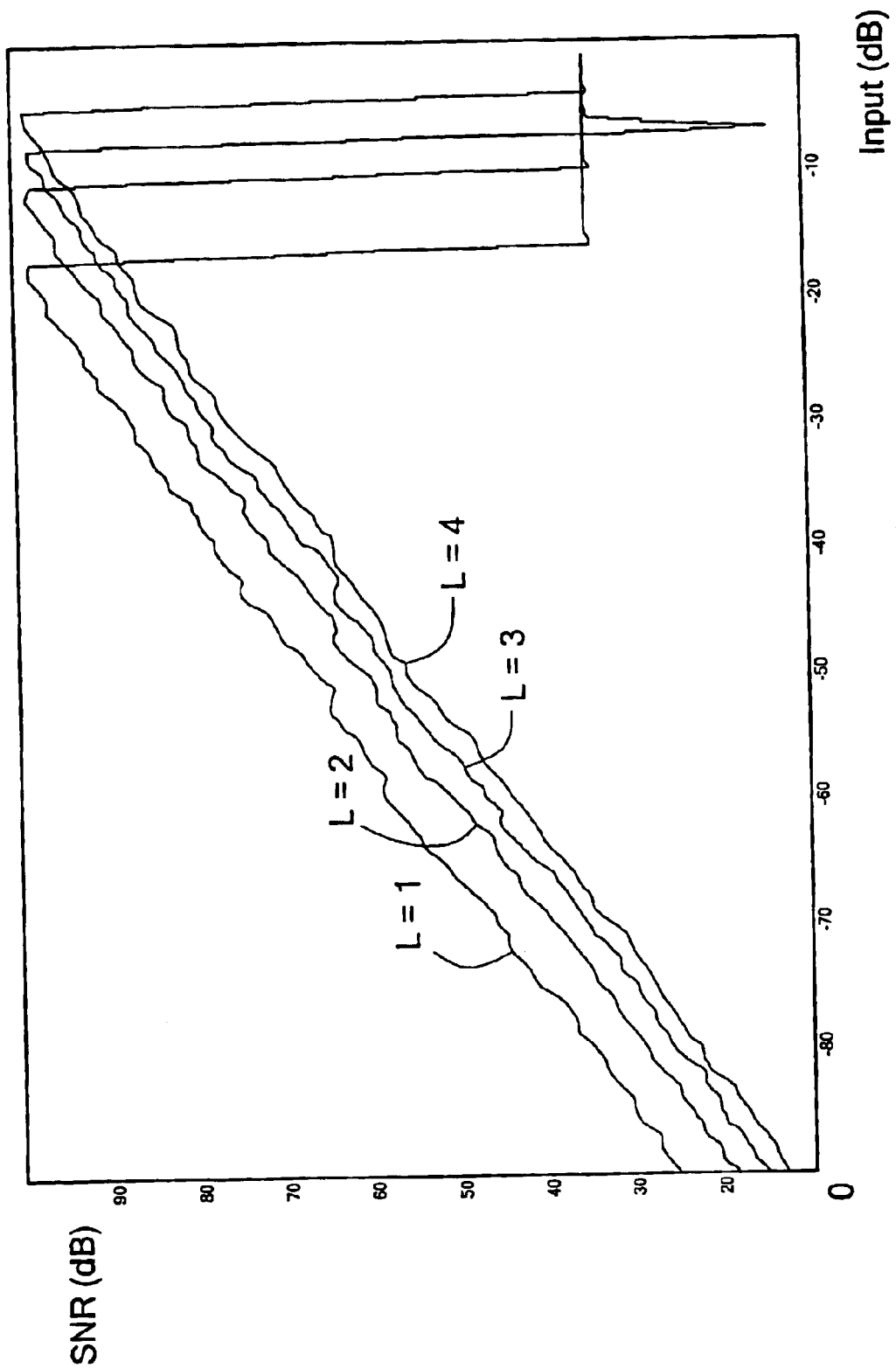
FIG. 4 is a diagram illustrating the signal-to-noise ratio versus input amplitude for a $4^{th}$-order configuration of the sigma-delta digital-to-analog converter of FIG. 2.

FIG. 4 depicts the Signal-to-Noise Ratio (SNR) versus the amplitude of the digital input signal for the above-described $4^{th}$-order configuration of the sigma-delta DAC 200 (p=3). Specifically, FIG. 4 illustrates the SNR versus the input signal level for each of the respective L values 1, 2, 3, and 4. As shown in FIG. 4, the SNR is highest for L=1 and is successively lower for L=2, 3, and 4. In the presently disclosed embodiment, even though the resulting SNR may be lower, the value of L is normally increased as the input signal level increases to avoid a potential overload condition. For this reason, the quantizer controller 218 monitors the level of the digital input signal and controls the variable quantizer 204 to increase the value of L as required for large digital input signals.

As described above, the quantizer controller 218 generally controls the variable quantizer 204 to decrease the value of L as the input signal level decreases. It is noted that the quantizer controller 218 is configured to decrease the L value at a rate slow enough to maintain the stability of the sigma-delta DAC 200 (see FIG. 2). If the value of L were decreased at too fast a rate, then the sigma-delta modulator 201 may become at least temporarily unstable, even though the input signal level may be at or below the maximum signal level that can be reliably processed by the modulator 201. This is because the previously higher value of L may perturb the sigma-delta core circuit 202 to such an extent that the internal integrator levels are greater than what would normally be observed with the new lower value of L. Further, because of the "momentum" of the integrators in the sigma-delta core 202, the lower level of feedback due to the new lower L value may be insufficient to prevent overload. To avoid such unstable conditions, the quantizer controller 218 monitors the levels of the sigma-delta core's integrators via the line 220. Based on the integrator levels, the quantizer controller 218 may then (1) defer decreasing the value of L until a suitable later time, or (2) decrease the L value as dictated by the input signal level and, in the event an overload condition is imminent, temporarily revert to the higher value of L. It is appreciated that such instability generally does not occur when the value of L is increased.

It should be noted that changing the value of L gradually would typically reduce the amount of switching of L in the sigma-delta DAC 200 (see FIG. 2). Further, provided that the interval between successive changes in the L value is on the order of, e.g., milliseconds or tens of milliseconds, any audible artifacts resulting therefrom would likely be minimal.

Figure 5:
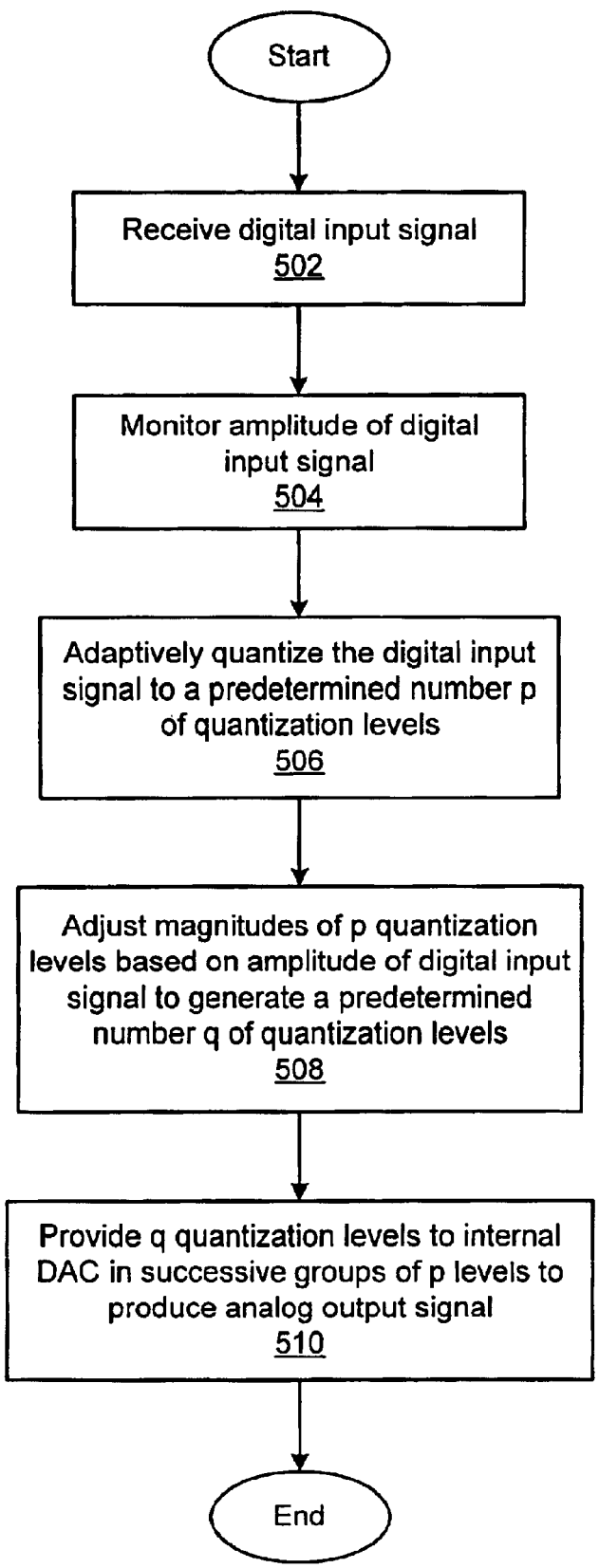
FIG. 5 is a flow diagram of a method of operating the sigma-delta digital-to-analog converter of FIG. 2.

A method of operating the presently disclosed sigma-delta DAC is illustrated by reference to FIG. 5. As depicted in step 502, a digital input signal is received by the sigma-delta core circuit. The amplitude of the digital input signal is then monitored, as depicted in step 504, by the quantizer controller included in the sigma-delta modulator. Next, the digital input signal is adaptively quantized, as depicted in step 506, to a first predetermined number p of quantization levels using the variable quantizer included in the sigma-delta modulator. The magnitudes of the p quantization levels are then adjusted, as depicted in step 508, via the quantizer controller based on the amplitude of the digital input signal, thereby generating a second predetermined number q of quantization levels. Finally, the q quantization levels are provided, as depicted in step 510, to the internal DAC included in the sigma-delta DAC in successive groups of p levels to produce an analog output signal corresponding to the digital input signal.

The presently disclosed sigma-delta DAC enables digital-to-analog signal conversions to be performed over wide signal ranges without sacrificing linearity. Further, because the above-described digital-to-analog signal conversion techniques prevent out-of-band quantization noise from inter-modulating back into thee pass band, signal distortion and noise are reduced. Moreover, the sigma-delta DAC disclosed herein has an implementation that is simpler than that of conventional sigma-delta DACs because it does not require the use of complicated techniques to enhance the linearity of the internal DAC function.

It should be understood that the above-described techniques for widening the signal range and increasing the linearity of a sigma-delta DAC may also be employed in DACs that operate by adjusting the widths of output pulses to achieve the different values of L, or in any other suitable type of DAC. The techniques described herein may also be employed in any other suitable signal processor such as any suitable type of Analog-to-Digital Converter (ADC).

It will further be appreciated by those of ordinary skill in the art that modifications to and variations of the above-described variable, adaptive quantization in sigma-delta modulators may be made without departing from the inventive concepts disclosed herein. Accordingly, the invention should not be viewed as limited except as by the scope and spirit of the appended claims.

What is claimed is:

1. An adaptive sigma-delta modulator, comprising:
   an input stage configured to receive a digital input signal having an amplitude;
   a quantizer operatively connected to the input stage, the quantizer being configured to quantize the digital input signal to a first predetermined number p of quantization levels, each quantization level having an associated magnitude, and
   a quantizer controller configured to monitor the amplitude of the digital input signal, and to control the quantizer for selectively adjusting the magnitudes associated with one or more of the p quantization levels based on the input signal amplitude, thereby generating a quantized digital signal including a second predetermined number q of quantization levels and representing the digital input signal.

2. The modulator of claim 1 wherein the quantizer is configured to provide the quantized digital signal to a Digital-to-Analog Converter (DAC), the DAC being configured to convert the quantized digital signal into an analog signal that corresponds to the digital input signal.

3. The modulator of claim 2 wherein the quantizer is configured to provide the quantized digital signal to the DAC is successive groups of quantization levels, each group including p levels.

4. The modulator of claim 2 wherein the magnitude associated with each quantization level is selected from a discrete set having a third predetermined number I of magnitude values, p=2, and the DAC is configured to convert up to q=2*I quantization levels.

5. The modulator of claim 2 wherein the magnitude associated with each quantization level is selected from a discrete set having a third predetermined number of magnitude values, p=3, and the DAC is configured to convert up to q=(2*I)+1 quantization levels.

6. The modulator of claim 1 wherein the quantizer is configured so that its gain is constant independent of the magnitudes of the respective quantization levels.

7. The modulator of claim 1 wherein the quantizer controller is configured to monitor levels associated with one or more Integrators included in the sigma-delta input stage, and to control the quantizer for selectively adjusting the magnitudes associated with one or more of the quantization levels based on the integrator levels.

8. A method of performing sigma-delta modulation, comprising the steps of:
   receiving a digital input signal, the digital input signal having an amplitude;
   quantizing the digital input signal to a first predetermined number p of quantization levels, each quantization level having an associated magnitude;
   monitoring the amplitude of the digital input signal; and
   selectively adjusting the magnitudes associated with one or more of the p quantization levels based on the input signal amplitude, thereby generating a quantized digital signal including a second predetermined number q of quantization levels and representing the digital input signal.

9. The method of claim 8 further including converting the quantized digital signal into an analog signal that corresponds to the digital input signal.

10. The method of claim 9 wherein the converting step includes providing the quantized digital signal to a Digital-to-Analog Converter (DAC) in successive groups of quantization levels, each group including p levels.

11. The method of claim 9 wherein the magnitude associated with each quantization level is selected from a discrete set having a third predetermined number I of magnitude values, p=2, and the converting step includes converting up to q=2*1 quantization levels into the analog signal.

12. The method of claim 9 wherein the magnitude associated with each quantization level is selected from a discrete set having a third predetermined number I of magnitude values, p=3, and the converting step includes converting up to q=(2*I)+1 quantization levels into the analog signal.

13. The method of claim 8 further including quantizing the digital Input signal to the predetermined number p of quantIzation levels by a quantizer, the quantizer having an associated gain that is constant independent of the magnitudes of the respective quantization levels.

14. The method of claim 8 wherein the receiving step includes receiving the digital input signal by an input stage including one or more integrators, and further including monitoring levels associated with the Integrators, wherein the adjusting step includes selectively adjusting the magnitudes associated with one or more of the p quantization levels based on the integrator levels.

15. An adaptive simga-delta modulator, comprising:
   an input stage configured to receive a digital input signal having an amplitude;
   a quantizer operatively connected to the input stage, the quantizer being configured to quantize the digital input signal to a first predetermined number p of guantization levels, each quantization level having an associated magnitude, and
   a quantizer controller configured to monitor the amplitude of the digital input signal, and to control the quantizer for selectively adjusting the magnitudes associated with one or more of the p quantization levels based on the direct input signal amplitude, thereby generating a quantized digital signal including a second predetermined number q of quantization levels and representng the digital input signal.

* * * * *